(12) United States Patent
Matsuno

(10) Patent No.: US 7,005,086 B2
(45) Date of Patent: Feb. 28, 2006

(54) FLUORESCENT SUBSTANCE, LIGHT-EMITTING DIODE AND METHOD FOR PRODUCING FLUORESCENT SUBSTANCE

(75) Inventor: Kenji Matsuno, Kyotanabe (JP)

(73) Assignee: Seiwa Electric Mfg. Co., Ltd., Kyoto (JP)

( * ) Notice: Subject to any disclaimer, the term of this patent is extended or adjusted under 35 U.S.C. 154(b) by 0 days.

(21) Appl. No.: 10/701,567

(22) Filed: Nov. 6, 2003

(65) Prior Publication Data

US 2004/0089846 A1   May 13, 2004

(30) Foreign Application Priority Data

Nov. 8, 2002   (JP) .............................. 2002-325742

(51) Int. Cl.
*C09K 11/56* (2006.01)
*C09K 11/62* (2006.01)
*C09K 11/55* (2006.01)

(52) U.S. Cl. ............................................. 252/301.6 S
(58) Field of Classification Search ......... 252/301.4 S; 257/98, E33.061
See application file for complete search history.

(56) References Cited

U.S. PATENT DOCUMENTS

| | | | |
|---|---|---|---|
| 3,639,254 A | * | 2/1972 | Peters ................... 252/301.4 S |
| 3,691,104 A | * | 9/1972 | Hanada .................... 252/501.1 |
| 6,090,434 A | | 7/2000 | Sugiura et al. |
| 6,417,019 B1 | * | 7/2002 | Mueller et al. ................ 438/29 |
| 6,544,438 B1 | * | 4/2003 | Yocom et al. ..................... 1/1 |
| 2002/0014614 A1 | | 2/2002 | Yocom et al. |

FOREIGN PATENT DOCUMENTS

| | | |
|---|---|---|
| EP | 0 740 490 A1 | 10/1996 |
| EP | 1 251 159 A2 | 10/2002 |
| JP | 2927279 B2 | 5/1999 |
| JP | 3246386 B2 | 11/2001 |

OTHER PUBLICATIONS

Benalloul P. et al., "$SrGa_2S_4$ : RE phosphors for full colour electroluminescent displays," Journal of Alloys and Compounds, Elsevier Science S.A., Paris, France, vol. 275-277, Jul. 24, 1998, pp. 709-715.

* cited by examiner

*Primary Examiner*—C. Melissa Koslow
(74) *Attorney, Agent, or Firm*—Birch, Stewart, Kolasch & Birch, LLP

(57) ABSTRACT

A fluorescent substance is obtained by weighing and mixing CaS, $Ga_2S_3$, EuS and $Ce_2S_3$ in a mole ratio of (1-x):a:x:y (wherein $0.001 \leq x \leq 0.2$, $0.0001 \leq y \leq 0.02$ and $0.5 \leq a \leq 5$) and by sintering the mixture. A light-emitting diode comprises an LED chip 2 and an LED chip sealing portion 5, made of silicone resin and including the fluorescent substance, for enclosing the LED chip 2. Hence, a fluorescent substance that is excited by light having a predetermined wavelength to emit light, a light-emitting diode having excellent luminous efficiency and luminous intensity, and a method for producing the fluorescent substance are attained by the present invention.

2 Claims, 4 Drawing Sheets

US 7,005,086 B2

FLUORESCENT SUBSTANCE, LIGHT-EMITTING DIODE AND METHOD FOR PRODUCING FLUORESCENT SUBSTANCE

BACKGROUND OF THE INVENTION

1. Field of the Invention

The present invention relates to: a fluorescent substance that is excited by light having a predetermined wavelength to emit light; a light-emitting diode including the fluorescent substance, provided with an enclosing portion for enclosing a light-emitting diode (hereafter referred to as LED) chip and used for displays, illumination, LCD backlights or the like; and a method for producing the fluorescent substance.

2. Description of Related Art

An LED, a light-emitting device, is compact, capable of emitting bright color light efficiently, excellent in drive characteristics, and highly resistant against vibration and repeated ON/OFF lighting. For these reasons, it is used as various indicators and various light sources.

As LED chips serving as semiconductor light-emitting devices, LED chips emitting light of various colors have become commercially practical, for example, short-wavelength LED chips including a GaN-based semiconductor as a luminous layer to emit light of colors, such as ultraviolet, blue and cyan, and high-luminance red LED chips. For example, an LED lamp capable of emitting light of various colors, wherein three LED chips, blue, red and green, for example, are mounted to produce colors by adjusting the brightness of each LED chip, have also become commercially practical and is used for full color displays and the like. In addition, an LED lamp capable of emitting white light, obtained by mounting a plurality of LED chips in one lamp or by combining an LED chip with a fluorescent substance, is expected as a future illumination light source.

Available LEDs wherein the color of the light emitted from an LED chip is converted by a fluorescent substance are LEDs described in, for example, Japanese Patent No. 2927279 and Japanese Patent No. 3246386. In these LEDs, the color of the light emitted from one kind of LED chip can be converted into white or the like by including a YAG ($Y_3Al_5O_{12}$):Ce-based fluorescent substance in an enclosing portion, made of synthetic resin, for enclosing an LED chip.

However, in the case where an LED is produced by including the above-mentioned YAG:Ce-based fluorescent substance in the LED chip enclosing portion, the luminous intensity and the luminous efficiency of the LED are insufficient. It is therefore requested to develop a fluorescent substance that can enhance the luminous intensity and the luminous efficiency and can decrease the power consumption of the LED.

Furthermore, since the fluorescent substance is exposed to high-energy light emitted from the LED chip, it deteriorates with time and blackens, thereby causing problems of making color conversion nonuniform, making the light emission of the LED nonuniform and lowering the extraction efficiency of the light emitted from the LED. In the case where moisture enters the interior of the enclosing portion, the deterioration of the fluorescent substance is accelerated by the high-energy light, heat and the like from the LED chip, whereby the above-mentioned problems are apt to occur more frequently. It is therefore requested to develop a fluorescent substance that hardly reacts with moisture and does not deteriorate with time.

BRIEF SUMMARY OF THE INVENTION

The present invention has been made with the aim of solving the above problems, and it is an object thereof to provide a fluorescent substance obtained by sintering a mixture including CaS, $Ga_2S_3$ and EuS, wherein in the case where an LED is produced by including the fluorescent substance in its enclosing portion for enclosing an LED chip, the fluorescent substance is efficiently excited by the light emitted from the LED chip to emit light, and excellently converts the color of the light emitted from the LED chip, whereby the LED has excellent luminous efficiency and high luminous intensity, the LED can stably emit light being uniform in luminance and color, and the luminous efficiency of the LED does not decrease with time.

Another object of the present invention is to provide a fluorescent substance obtained by weighing and mixing CaS, $Ga_2S_3$ and EuS in a mole ratio of (1-x):a:x (wherein $0.001 \leq x \leq 0.2$ and $0.5 \leq a \leq 5$) and by sintering the mixture so as to have more excellent luminous efficiency when excited, wherein in the case where an LED is produced by including the fluorescent substance in an enclosing portion for enclosing an LED chip, the LED can emit light more stably while having excellent luminous efficiency and high luminous intensity. The present invention is also intended to provide a method for producing such a fluorescent substance.

Another object of the present invention is to provide a fluorescent substance obtained by weighing and mixing CaS, $Ga_2S_3$, EuS and $Ce_2S_3$ in a mole ratio of (1-x):a:x:y (wherein $0.001 \leq x \leq 0.2$, $0.0001 \leq y \leq 0.02$ and $0.5 \leq a \leq 5$) so as to have more excellent luminous efficiency when excited, wherein in the case where an LED is produced by including the fluorescent substance in an enclosing portion for enclosing an LED chip, the LED can emit light more stably while having excellent luminous efficiency and high luminous intensity. The present invention is also intended to provide a method for producing such a fluorescent substance.

It is still another object of the present invention to provide an LED comprising an LED chip emitting light having a main peak in a wavelength range of 430 to 550 nm and an enclosing portion, including the fluorescent substance according to the present invention, for enclosing part or the whole of the LED chip, wherein the fluorescent substance included in the enclosing portion is efficiently excited by the light emitted from the LED chip to emit light, and excellently converts the color of the light emitted from the LED chip, whereby the LED can stably emit light while having excellent luminous efficiency and high luminous intensity, and power consumption can be decreased.

The fluorescent substance according to the present invention is excited by light having a predetermined wavelength to emit light. The fluorescent substance is obtained by sintering a mixture including CaS, $Ga_2S_3$ and EuS.

Being activated by Eu, this fluorescent substance is efficiently excited in a wide wavelength range to emit light.

In the case where a light-emitting diode is produced by including the fluorescent substance in the enclosing portion thereof, made of synthetic resin or the like, for enclosing a light-emitting diode chip, the fluorescent substance is efficiently excited by the light emitted from the light-emitting diode chip to emit light, and excellently converts the color of the light emitted from the light-emitting diode chip. As a result, the light-emitting diode has excellent luminous efficiency and high luminous intensity.

In addition, the fluorescent substance hardly reacts with water and does not deteriorate with time, whereby the light-emitting diode can stably emit light being uniform in luminance and color, and the luminous efficiency thereof does not decrease with time.

The fluorescent substance according to the present invention may be obtained by weighing and mixing CaS, $Ga_2S_3$ and EuS in a mole ratio of (1-x):a:x and by sintering the mixture, wherein $0.001 \leq x \leq 0.2$ and $0.5 \leq a \leq 5$.

In the case where a light-emitting diode is produced by including this fluorescent substance in the enclosing portion thereof, the luminance of the light-emitting diode lowers when "x" is less than 0.001, and concentration quenching occurs when "x" is more than 0.2. Hence, "x" is set at 0.001 or more and 0.2 or less. In addition, the luminous intensity of the light-emitting diode is insufficient when "a" is less than 0.5, and the luminous intensity decreases when "a" is more than 5. Hence, "a" is set at 0.5 or more and 5 or less.

In the case where a light-emitting diode is produced by including this fluorescent substance in its enclosing portion for enclosing a light-emitting diode chip, the fluorescent substance is more efficiently excited by the light emitted from the light-emitting diode chip to emit light, and more excellently converts the color of the light emitted from the light-emitting diode chip. Hence, the light-emitting diode can more stably emit light while having excellent luminous efficiency and high luminous intensity.

The fluorescent substance according to the present invention may be obtained by adding $Ce_2S_3$ to the above-mentioned mixture and by sintering the obtained mixture.

This fluorescent substance has more excellent luminous efficiency when excited.

The fluorescent substance according to the present invention may be obtained by weighing and mixing CaS, $Ga_2S_3$, EuS and $Ce_2S_3$ in a mole ratio of (1-x):a:x:y and by sintering the mixture, wherein $0.001 \leq x \leq 0.2$, $0.5 \leq a \leq 5$ and $0.0001 \leq y \leq 0.02$.

In the case where a light-emitting diode is produced by including this fluorescent substance in the enclosing portion thereof, the luminance of the light-emitting diode lowers when "x" is less than 0.001, and concentration quenching occurs when "x" is more than 0.2. Hence, "x" is set at 0.001 or more and 0.2 or less. In addition, the light-emitting diode does not function when "y" is less than 0.0001, and concentration quenching occurs when "y" is more than 0.02. Hence, "y" is set at 0.0001 or more and 0.02 or less. Furthermore, the luminous intensity of the light-emitting diode is insufficient when "a" is less than 0.5, and the luminous intensity decreases when "a" is more than 5. Hence, "a" is set at 0.5 or more and 5 or less.

In the case where a light-emitting diode is produced by including this fluorescent substance in its enclosing portion for enclosing a light-emitting diode chip, the fluorescent substance is more efficiently excited by the light emitted from the light-emitting diode chip to emit light, and more excellently converts the color of the light emitted from the light-emitting diode chip. Hence, the light-emitting diode can more stably emit light while having excellent luminous efficiency and high luminous intensity.

The light-emitting diode according to the present invention comprises a light-emitting diode chip emitting light having a main peak in a wavelength range of 430 to 550 nm and an enclosing portion, including the fluorescent substance according to the present invention, for enclosing part or the whole of the above-mentioned light-emitting diode chip.

This light-emitting diode includes, in the enclosing portion thereof, the fluorescent substance that is efficiently excited by light having a main peak in a wavelength range of 430 to 550 nm and emitted from the light-emitting diode chip to emit light, and excellently converts the color of the light emitted from the light-emitting diode chip. Hence, the light-emitting diode has excellent luminous efficiency and high luminous intensity. As a result, the power consumption of the light-emitting diode can be decreased.

In addition, the fluorescent substance hardly reacts with water and does not deteriorate with time, whereby the light-emitting diode can stably emit light being uniform in luminance and color, and the luminous efficiency thereof does not decrease with time.

A fluorescent substance production method according to the present invention comprises steps of weighing and mixing CaS, $Ga_2S_3$ and EuS in a mole ratio of (1-x):a:x, sintering the obtained mixture at 800 to 1100° C. for 30 minutes to 5 hours, cooling the obtained sintered substance, and grinding and mixing the cooled sintered substance, wherein $0.001 \leq x \leq 0.2$ and $0.5 \leq a \leq 5$.

In this production method, it is possible to obtain a fluorescent substance activated by Eu, wherein in the case where a light-emitting diode is produced by including the fluorescent substance in its enclosing portion for enclosing a light-emitting diode chip, the fluorescent substance is efficiently excited by the light emitted from the light-emitting diode chip to emit light, and excellently converts the color of the light emitted from the light-emitting diode chip. As a result, the light-emitting diode including this fluorescent substance in the enclosing portion thereof has excellent luminous efficiency and high luminous intensity.

In addition, the fluorescent substance hardly reacts with water and does not deteriorate with time, whereby the light-emitting diode can stably emit light being uniform in luminance and color, and the luminous efficiency thereof does not decrease with time.

Another fluorescent substance production method according to the present invention comprises steps of weighing and mixing CaS, $Ga_2S_3$, EuS and $Ce_2S_3$ in a mole ratio of (1-x):a:x:y, sintering the obtained mixture at 800 to 1100° C. for 30 minutes to 5 hours, cooling the obtained sintered substance, and grinding and mixing the cooled sintered substance, wherein $0.001 \leq x \leq 0.2$, $0.0001 \leq y \leq 0.02$ and $0.5 \leq a \leq 5$.

In this production method, it is possible to obtain a fluorescent substance activated by Eu, wherein in the case where a light-emitting diode is produced by including the fluorescent substance in its enclosing portion, made of synthetic resin, for enclosing a light-emitting diode chip, the fluorescent substance is more efficiently excited by the light emitted from the light-emitting diode chip to emit light, and more excellently converts the color of the light emitted from the light-emitting diode chip. As a result, the light-emitting diode including this fluorescent substance in the enclosing portion thereof has excellent luminous efficiency and high luminous intensity.

The above and further objects and features of the invention will more fully be apparent from the following detailed description with accompanying drawings.

DETAILED DESCRIPTION OF THE INVENTION

The present invention will be described below in detail on the basis of the drawings showing embodiments thereof.

First Embodiment

A fluorescent substance according to First Embodiment is obtained by mixing CaS, $Ga_2S_3$ and EuS in a mole ratio of (1-x):a:x and by sintering the mixture, wherein $0.001 \leq x \leq 0.2$ and $0.5 \leq a \leq 5$.

In the case where an LED is produced by including this fluorescent substance in the enclosing portion thereof, the luminance of the LED lowers when "x" is less than 0.001, and concentration quenching occurs when "x" is more than 0.2. Hence, "x" is set at 0.001 or more and 0.2 or less. In addition, the luminous intensity of the LED is insufficient when "a" is less than 0.5, and the luminous intensity decreases when "a" is more than 5. Hence, "a" is set at 0.5 or more and 5 or less. It is confirmed by experiments that the luminous intensity rises to a maximum value when "a" is about 1.5, that the luminous intensity tends to lower when "a" is more than 1.5, and that the luminous intensity is in an about 90% decrease range when "a" is 5.

For producing this fluorescent substance, first, powders of CaS, $Ga_2S_3$ and EuS are put in a ball mill so as to have a mole ratio of (1-x):a:x and mixed for about one hour.

Next, this mixture is sealed in a quartz glass tube and sintered at 1000° C. for about one hour in an atmospheric furnace.

After being cooled, the obtained sintered substance is ground and mixed.

In the end, the obtained substance is washed and classified, whereby the fluorescent substance according to this embodiment is obtained.

Figure 1:
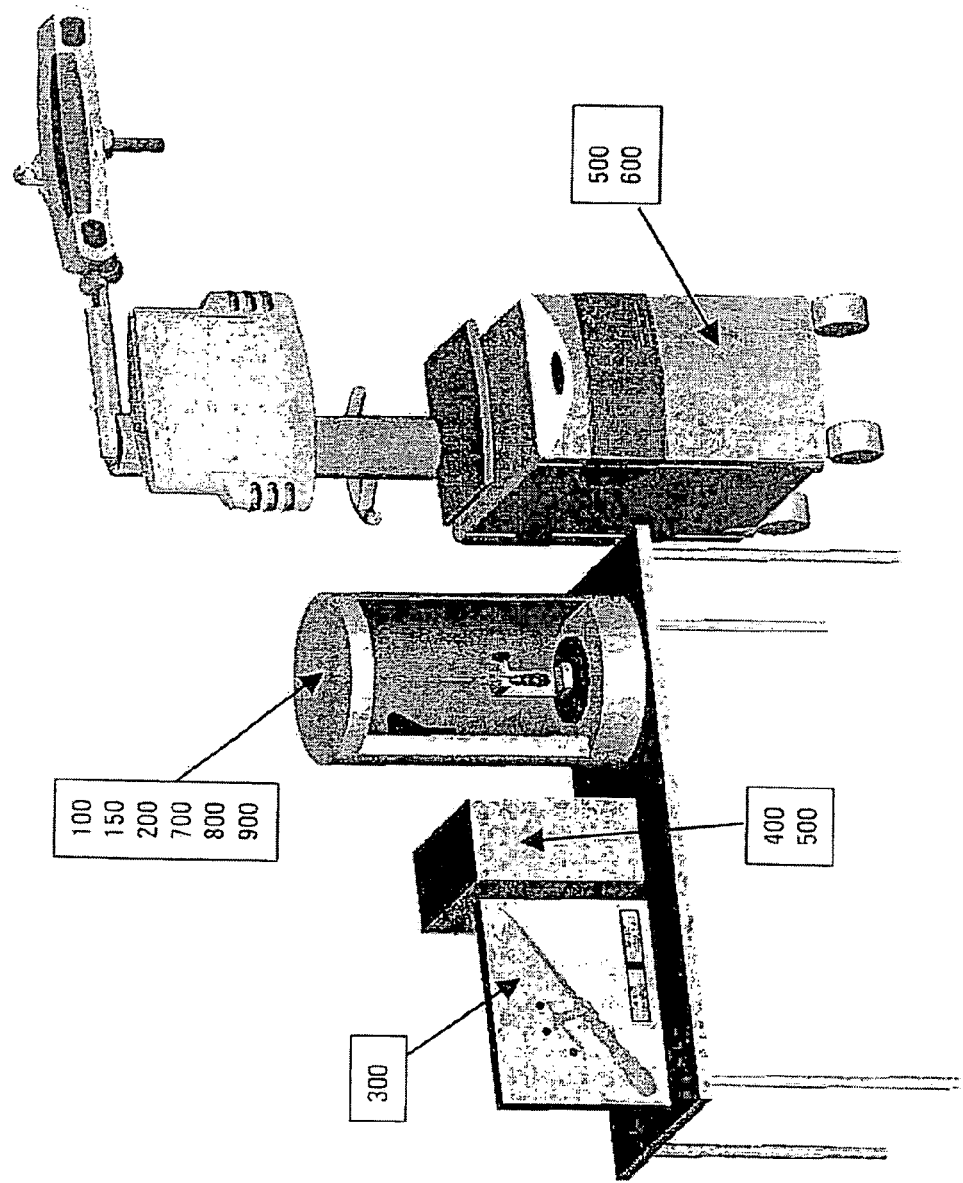
FIG. 1 is a graph showing the excitation spectrum and emission spectrum of a fluorescent substance according to First Embodiment of the present invention.

FIG. 1 is a graph showing the excitation spectrum and emission spectrum of the fluorescent substance according to this embodiment. The vertical axis indicates intensity while the horizontal axis indicates wavelength.

In the figure, "a" indicates the excitation spectrum of the fluorescent substance according to this embodiment while "b" indicates the emission spectrum thereof. The fluorescent substance according to this embodiment was obtained by weighing and mixing the powders of CaS, $Ga_2S_3$ and EuS in a mole ratio of 0.9:1.2:0.1 and by sintering the mixture.

Referring to FIG. 1, it is found that the emission spectrum of the fluorescent substance according to this embodiment has a peak in the vicinity of 520 nm, and the excitation emission efficiency thereof is high in a wide wavelength range of 430 to 550 nm.

Figure 2:
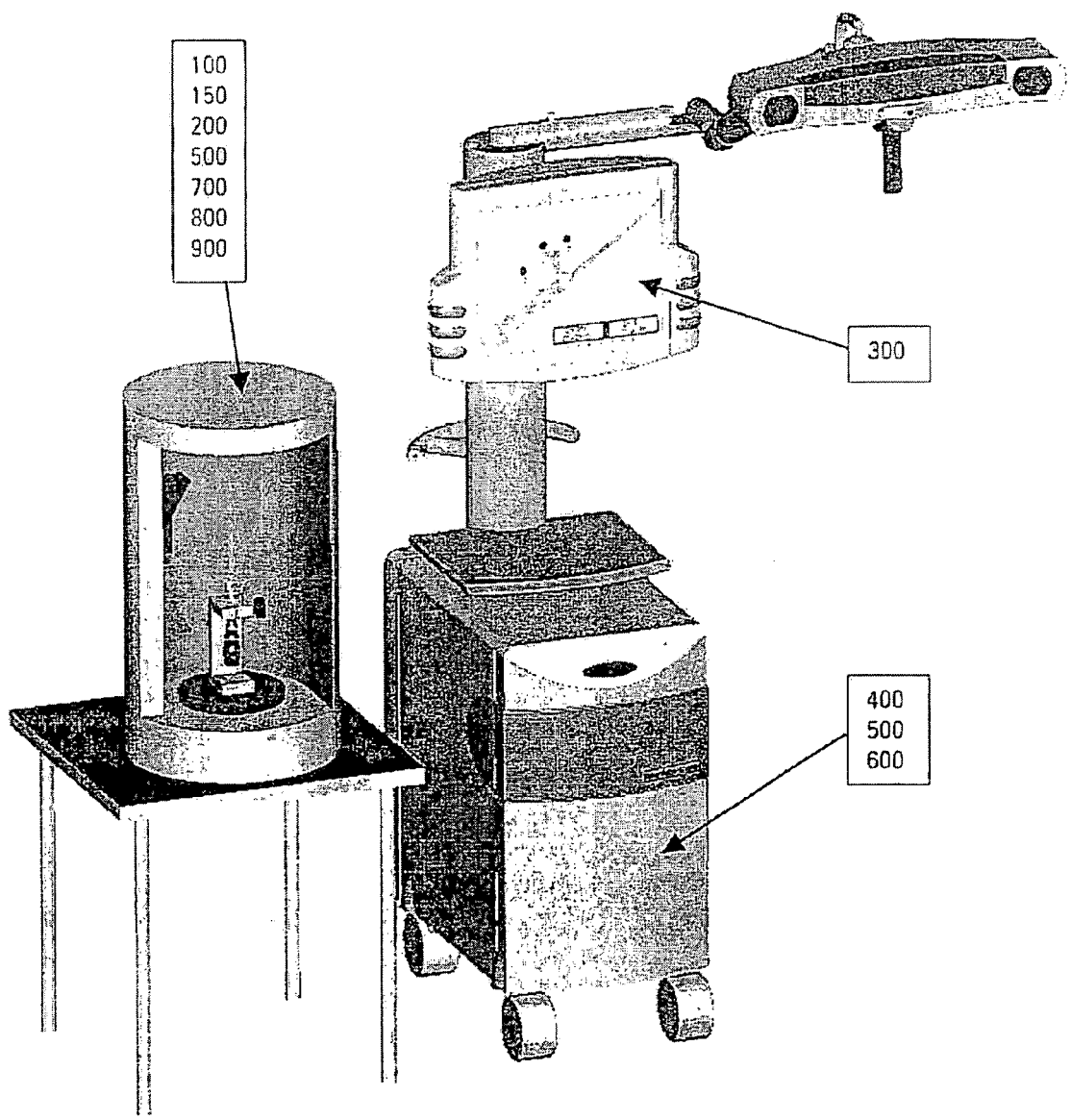
FIG. 2 is a sectional view showing an LED lamp according to First Embodiment of the present invention.

FIG. 2 is a sectional view showing an LED lamp (LED) according to First Embodiment. In the figure, the numeral 1 designates a lead frame.

An LED chip 2 having a GaN-based compound semiconductor as a luminous layer to emit blue light having a main peak in a wavelength range of 430 to 500 nm is bonded and secured to a recess 1a provided in the upper portion of the lead frame 1 by die bonding. By wire bonding, one of the electrodes of the LED chip 2 is connected to the lead frame 1 with a gold wire 4, and the other electrode is connected to a lead frame 3 with another gold wire 4.

The recess 1a is filled with a mixture of 5 to 30 wt % of the fluorescent substance according to this embodiment and 95 to 70 wt % of silicone resin in a convex shape, whereby an LED chip sealing portion (enclosing portion) 5 for sealing the LED chip 2 is formed.

The upper portion of the lead frame 1 wherein the LED chip sealing portion 5 is formed and the upper portion of the lead frame 3 are accommodated in a mold portion 6 made of epoxy resin, the end of which forms a convex lens portion.

For producing this LED lamp, first, the LED chip 2 is bonded to the recess 1a in the lead frame 1 by die bonding, and the electrodes of the LED chip 2 are connected to the lead frames 1 and 3, respectively, by wire bonding.

Next, 5 to 30 wt % of the fluorescent substance obtained as described above is mixed with 95 to 70 wt % of silicone resin. This mixture is injected or applied to the recess 1a and then hardened to form the LED chip sealing portion 5. Furthermore, epoxy resin in an unhardened state is poured into a bombshell-shaped framework, and the lead frame 1 wherein the LED chip sealing portion 5 is formed and the lead frame 3 are inserted into the framework in the opposite direction. The epoxy resin is hardened, whereby a mold portion 6 is formed.

In the LED lamp according to this embodiment, the LED chip 2 emits light having a main peak in a wavelength range of 430 to 500 nm. The fluorescent substance included in the LED chip sealing portion 5 is efficiently excited by the light emitted from the LED chip 2 to emit light, and excellently converts the blue light emitted from the LED chip 2 into white light. Hence, the LED has excellent luminous efficiency and high luminous intensity.

The luminous intensity of an LED lamp, which was produced such that the LED chip sealing portion 5 was formed by a mixture of 20 wt % of the fluorescent substance obtained by mixing CaS, $Ga_2S_3$ and EuS in a mole ratio of 0.9:1.2:0.1 and by sintering the mixture and 80 wt % of silicone resin, was compared with the luminous intensity of an LED lamp, which was produced such that the LED chip sealing portion 5 was formed by a mixture of 20 wt % of the conventional YAG $(Y_3Al_5O_{12})$:Ce-based fluorescent substance and 80 wt % of silicone resin. By this comparison, it was confirmed that the luminous intensity increased about 40%.

In addition, even in the case where an LED lamp was produced by mixing the above-mentioned fluorescent substance having been left in water for 10 hours with silicone resin, it was confirmed that the luminous efficiency did not lower, that the fluorescent substance according to this embodiment hardly reacted with water and did not deteriorate with time. Hence, the LED can stably emit light being uniform in luminance and color.

Second Embodiment

A fluorescent substance according to Second Embodiment is obtained by mixing CaS, $Ga_2S_3$, EuS and $Ce_2S_3$ in a mole ratio of (1-x):a:x:y and by sintering the mixture, wherein $0.001 \leq x \leq 0.2$, $0.5 \leq a \leq 5$ and $0.0001 \leq y \leq 0.02$.

In the case where an LED is produced by including this fluorescent substance in the enclosing portion thereof, the luminance of the LED lowers when "x" is less than 0.001, and concentration quenching occurs when "x" is more than 0.2. Hence, "x" is set at 0.001 or more and 0.2 or less. In addition, the LED does not function when "y" is less than 0.0001, and concentration quenching occurs when "y" is more than 0.02. Hence, "y" is set at 0.0001 or more and 0.02 or less. Furthermore, the luminous intensity of the LED is insufficient when "a" is less than 0.5, and the luminous intensity decreases when "a" is more than 5. Hence, "a" is set at 0.5 or more and 5 or less. It is confirmed by experiments that the luminous intensity rises to a maximum value when "a" is about 1.5, that the luminous intensity tends to lower when "a" is more than 1.5, and that the luminous intensity is in an about 90% decrease range when "a" is 5.

For producing this fluorescent substance, first, powders of CaS, $Ga_2S_3$, EuS and $Ce_2S_3$ are put in a ball mill so as to have a mole ratio of (1-x):a:x:y and mixed for about one hour.

Next, this mixture is sealed in a quartz glass tube and sintered at 1000° C. for about one hour in an atmospheric furnace.

After being cooled, the obtained sintered substance is ground and mixed.

In the end, the obtained substance is washed and classified, whereby the fluorescent substance according to this embodiment is obtained.

Figure 3:
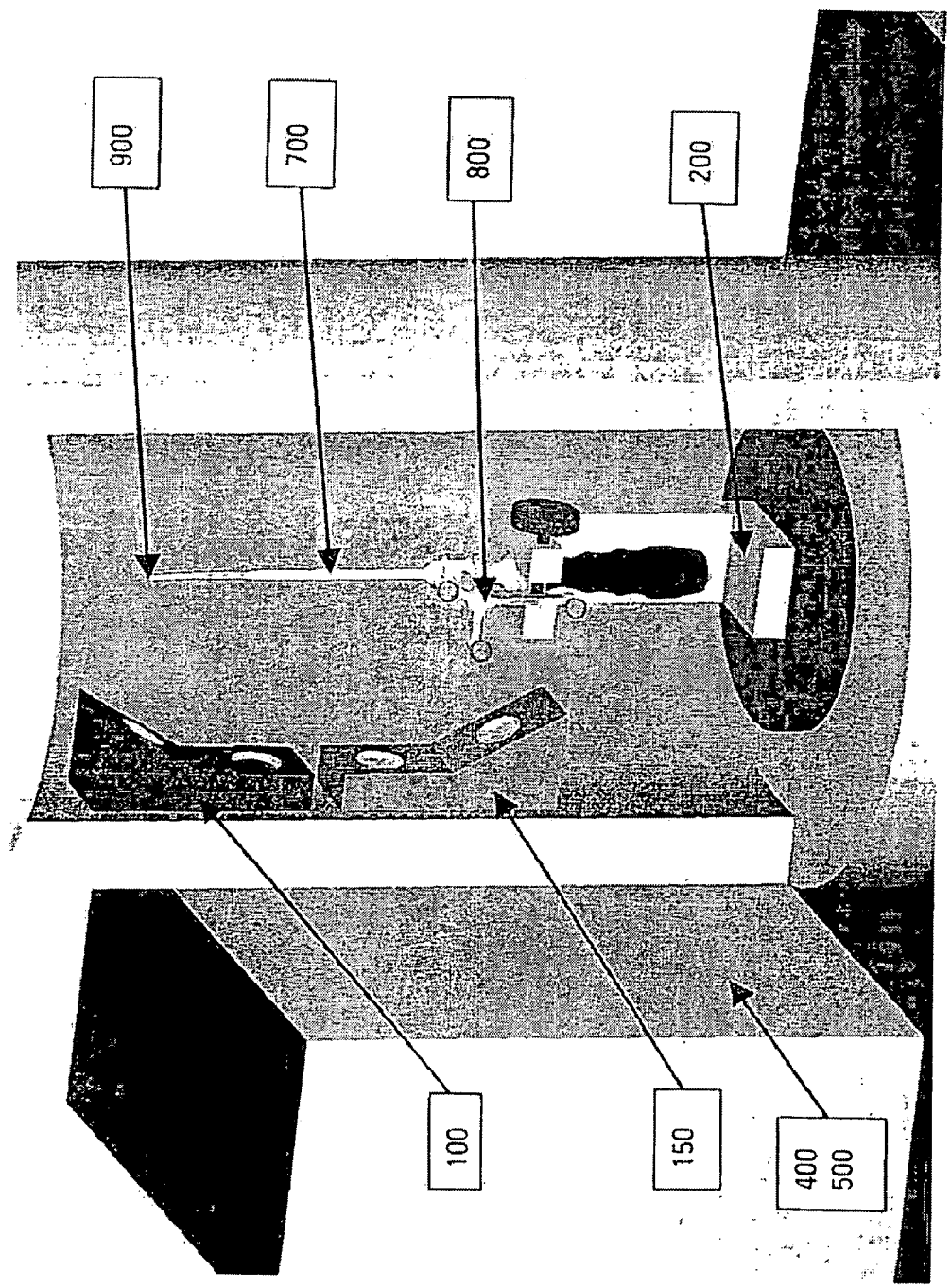
FIG. 3 is a graph showing the excitation spectrum and emission spectrum of a fluorescent substance according to Second Embodiment of the present invention.

FIG. 3 is a graph showing the excitation spectrum and emission spectrum of the fluorescent substance according to this embodiment. The vertical axis indicates intensity while the horizontal axis indicates wavelength.

In the figure, "a" indicates the excitation spectrum of the fluorescent substance according to this embodiment while "b" indicates the emission spectrum thereof. The fluorescent substance according to this embodiment was obtained by weighing and mixing the powders of CaS, $Ga_2S_3$, EuS and $Ce_2S_3$ in a mole ratio of 0.89:1.2:0.1:0.005 and by sintering the mixture.

Referring to FIG. 3, it is found that the emission spectrum of the fluorescent substance according to this embodiment has a peak in the vicinity of 520 nm, and the excitation emission efficiency thereof is high in a wide wavelength range of 430 to 550 nm.

Using the fluorescent substance obtained as described above, an LED lamp similar to the LED lamp shown in FIG. 2 according to First Embodiment was produced.

Just as in the case of the LED lamp according to First Embodiment, the LED chip sealing portion 5 of this LED lamp is formed by mixing 5 to 30 wt % of the fluorescent substance with 95 to 70 wt % of silicone resin, by injecting or applying this mixture to the recess 1a in the lead frame 1 and by hardening the mixture.

In the LED lamp according to this embodiment, the LED chip 2 emits light having a main peak in a wavelength range of 430 to 500 nm. The fluorescent substance included in the LED chip sealing portion 5 is efficiently excited by the light emitted from the LED chip 2 to emit light, and excellently converts the blue light emitted from the LED chip 2 into white light. Hence, the LED has excellent luminous efficiency and high luminous intensity.

The luminous intensity of an LED lamp, which was produced such that the LED chip sealing portion 5 was formed by a mixture of 20 wt % of the fluorescent substance obtained by weighing and mixing CaS, $Ga_2S_3$, EuS and $Ce_2S_3$ in a mole ratio of 0.89:1.2:0.1:0.005 and by sintering the mixture and 80 wt % of silicone resin, was compared with the luminous intensity of the LED lamp, which was produced such that the LED chip sealing portion 5 was formed by a mixture of 20 wt % of the conventional YAG $(Y_3Al_5O_{12})$:Ce-based fluorescent substance and 80 wt % of silicone resin. By this comparison, it was confirmed that the luminous intensity increased about 50%.

In addition, even in the case where an LED was produced such that the LED chip sealing portion 5 thereof was formed by mixing the above-mentioned fluorescent substance having been left in water for 10 hours with silicone resin, it was confirmed that the luminous efficiency did not lower, and that the fluorescent substance according to this embodiment hardly reacted with water and did not deteriorate with time. Hence, the LED can stably emit light being uniform in luminance and color.

Third Embodiment

Figure 4:
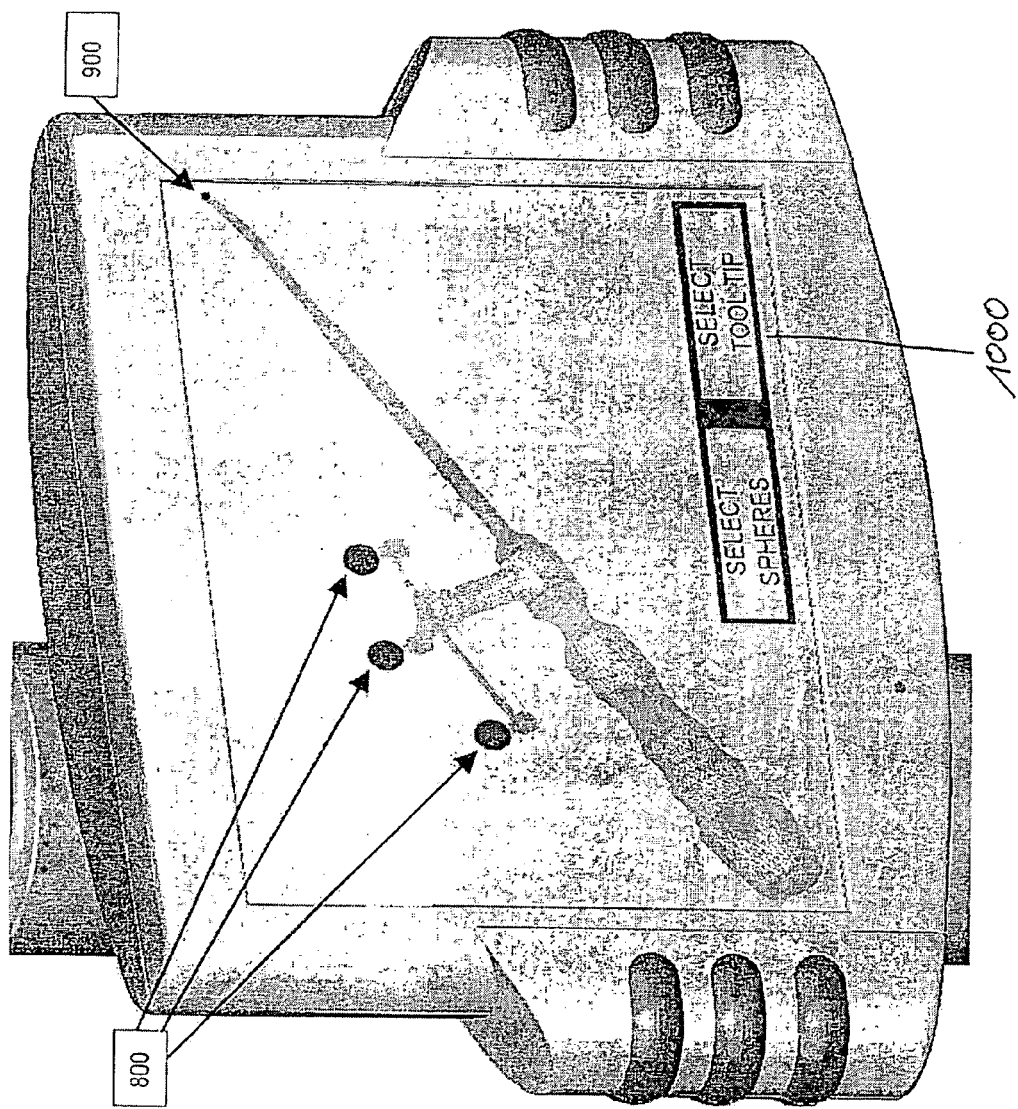
FIG. 4 is a sectional view showing the structure of a surface mount device LED according to Third Embodiment of the present invention.
Figure 1:
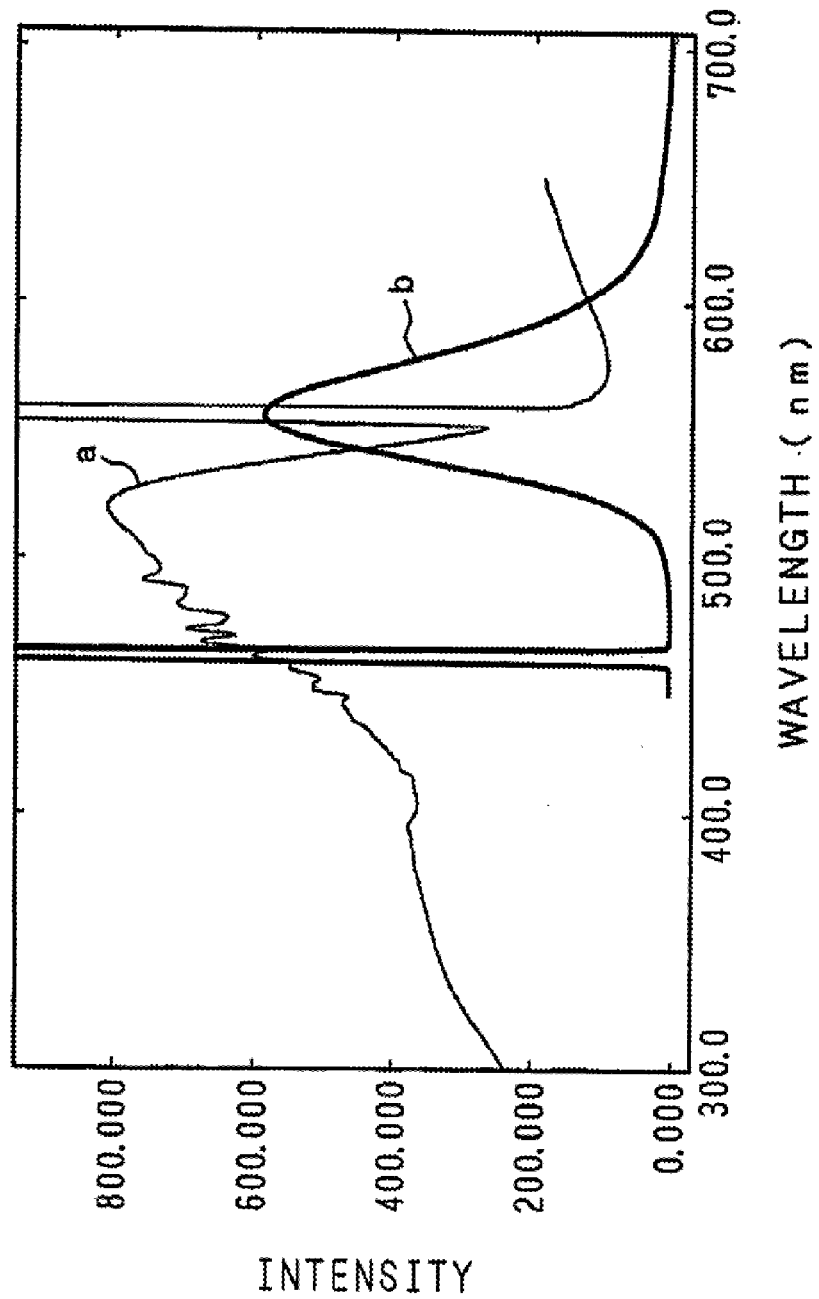
Figure 2:
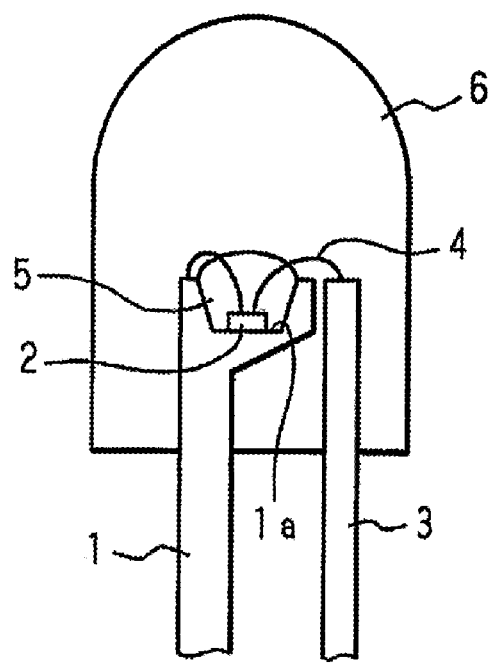
Figure 3:
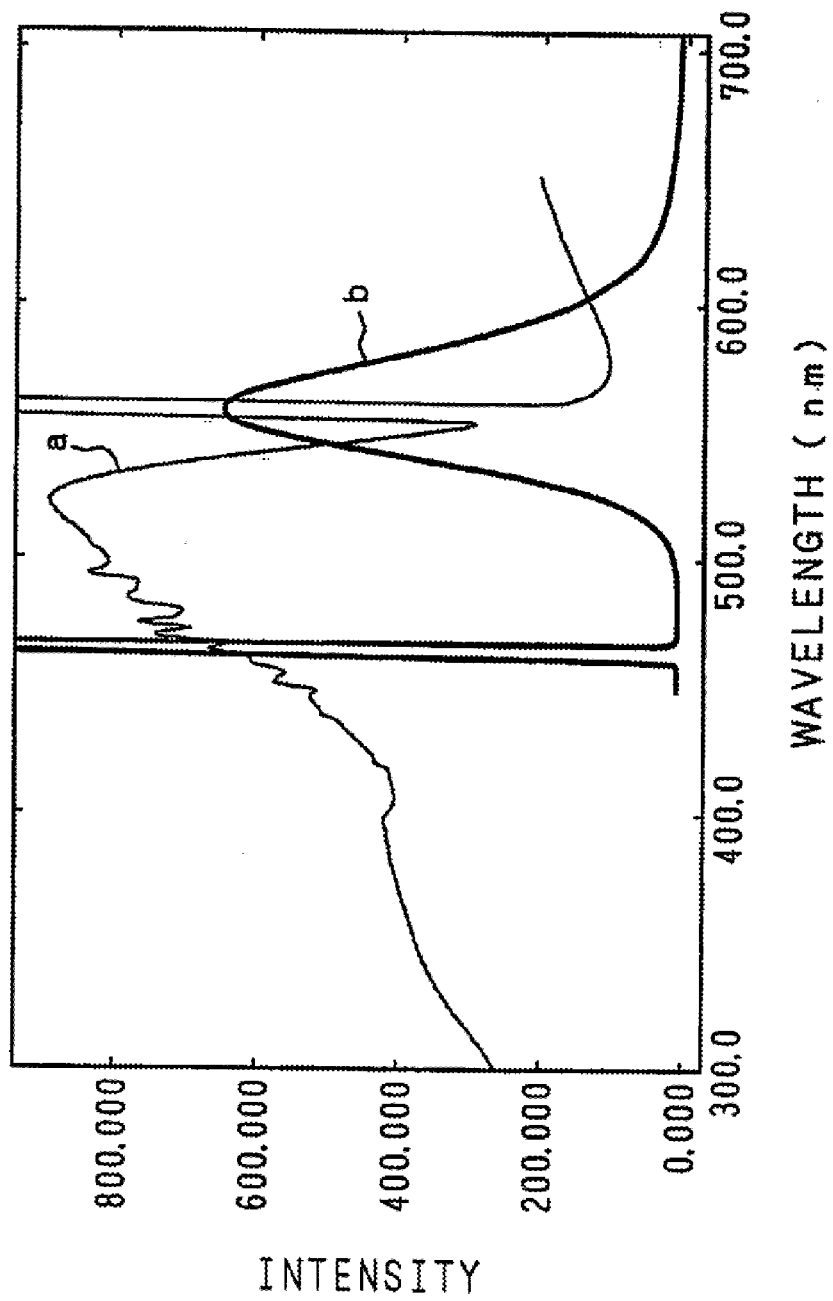
Figure 4:
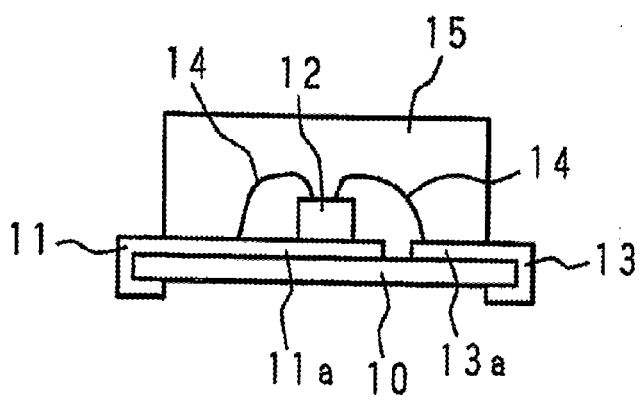

FIG. 4 is a sectional view showing the structure of a surface mount device LED according to Third Embodiment. In the figure, the numeral 10 designates a substrate.

External electrodes 11 and 13 for connection to an external circuit are provided respectively at both ends of the substrate 10 made of glass epoxy resin or the like. At the central portion of the external electrode 11, a chip loading portion 11a is provided so as to extend to the central portion of the substrate 10. At the end portion thereof, an LED chip 12 having a GaN-based compound semiconductor as a luminous layer to emit blue light having a main peak in a wavelength range of 430 to 500 nm is mounted. At the central portion of the external electrode 13, an internal electrode 13a is provided opposite to the chip loading portion 11a.

One of the electrodes of the LED chip 12 is connected to the chip loading portion 11a with a gold wire 14, and the other electrode is connected to the internal electrode 13a with another gold wire 14.

The LED chip 12 is sealed with a mold portion (enclosing portion) 15 formed of a mixture of 5 to 30 wt % of the same fluorescent substance as that of Second Embodiment and 95 to 70 wt % of epoxy resin.

For producing the surface mount device LED according to this embodiment, first, the LED chip 12 is mounted on the chip loading portion 11a on the substrate 10 with silver paste or the like. Then, one of the electrodes of the LED chip 12 is connected to the chip loading portion 11a with a gold wire 14 and the other electrode is connected to the internal electrode 13a with another gold wire 14.

Next, a mixture of 5 to 30 wt % of the fluorescent substance obtained in a way similar to that of Second Embodiment and 95 to 70 wt % of epoxy resin is poured into a recess in a mold, the form of the recess being corresponding to that of the mold portion 15. This mixture is hardened, whereby the mold portion 15 is formed.

In the surface mount device LED of this embodiment, the LED chip 12 emits light having a main peak in a wavelength range of 430 to 500 nm. The fluorescent substance included in the mold portion 15 is efficiently excited by the light emitted from the LED chip 12 to emit light, and excellently converts the blue light emitted from the LED chip 12 into white light. Hence, the LED has excellent luminous efficiency and high luminous intensity.

The luminous intensity of a surface mount device LED, which was produced such that the mold portion 15 was formed by a mixture of 20 wt % of the fluorescent substance obtained by weighing and mixing CaS, $Ga_2S_3$, EuS and $Ce_2S_3$ in a mole ratio of 0.89:1.2:0.1:0.005 and by sintering the mixture and 80 wt % of epoxy resin, was compared with the luminous intensity of a surface mount device LED, which was produced such that the mold portion 15 was formed by a mixture of the conventional YAG $(Y_3Al_5O_{12})$:Ce-based fluorescent substance and epoxy resin. By this comparison, it was confirmed that the luminous intensity increased about 50%.

In addition, as described above, the fluorescent substance according to this embodiment hardly reacts with water and does not deteriorate with time. Hence, the surface mount device LED can stably emit light being uniform in luminance and color, whereby the luminous efficiency thereof does not lower with time.

This surface mount device LED is visible from a wide range and has a wide viewing angle. Hence, the LED can be used for various displays, LCD backlights, sensors, indicators or the like.

In First and Second Embodiments described above, explanation is given for the case where the principal ingredient of the LED chip sealing portion 5 is silicone resin. However, the principal ingredient is not limited to this.

In First to Third Embodiments described above, explanation is given for the case where the principal ingredient of the mold portions 6 and 15 is epoxy resin. However, the principal ingredient is not limited to this.

Furthermore, explanation is given for the case where the LED chips 2 and 12 have a GaN-based compound semiconductor as a luminous layer. However, the luminous layer is not limited to this.

Still further, explanation is given for the case where the LED chips 2 and 12 emit light having a main peak in a wavelength range of 430 to 500 nm. However, the wavelength range is not limited to this. The fluorescent substance of the present invention can be included in an enclosing portion for enclosing an LED chip emitting light having a main peak in a wavelength range of 430 to 550 nm.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

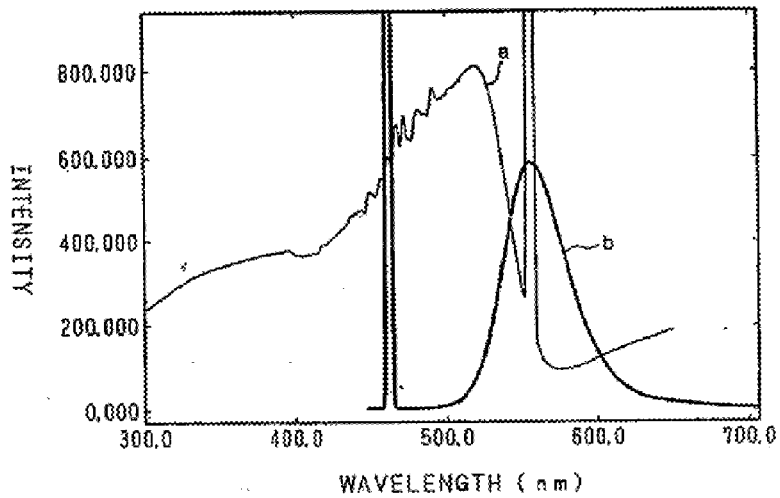

What is claimed is:

1. A fluorescent substance production method comprising steps of:

weighing and mixing CaS, $Ga_2S_3$ and EuS in a mole ratio of (1-x):a:x;

sealing the obtained mixture in a quartz glass tube;

sintering the obtained mixture at 800 to 1100° C. for 30 minutes to 5 hours;

cooling the obtained sintered substance; and grinding and mixing the cooled sintered substance, wherein $0.001 \leq x \leq 0.2$ and $0.5 \leq a \leq 5$.

2. A fluorescent substance production method comprising steps of:

weighing and mixing CaS, $Ga_2S_3$, EuS and $Ce_2S_3$ in a mole ratio of (1-x):a:x:y;

sealing the obtained mixture in a quartz glass tube;

sintering the obtained mixture at 800 to 1100° C. for 30 minutes to 5 hours;

cooling the obtained sintered substance; and grinding and mixing the cooled sintered substance, wherein $0.001 \leq x \leq 0.2$, $0.0001 \leq y \leq 0.02$ and $0.5 \leq a \leq 5$.

* * * * *

UNITED STATES PATENT AND TRADEMARK OFFICE
CERTIFICATE OF CORRECTION

PATENT NO. : 7,005,086 B2
APPLICATION NO. : 10/701567
DATED : February 28, 2006
INVENTOR(S) : Matsuno Page 1 of 6

It is certified that error appears in the above-identified patent and that said Letters Patent is hereby corrected as shown below:

Delete Title page illustrating figure, and substitute therefor, new Title page illustrating figure. (attached)

Delete drawing figures 1-4, and substitute therefor drawing figures 1-4, as shown on the attached sheets.

Signed and Sealed this

Twenty-eighth Day of November, 2006

JON W. DUDAS
*Director of the United States Patent and Trademark Office*

(12) United States Patent
Matsuno

(10) Patent No.: US 7,005,086 B2
(45) Date of Patent: Feb. 28, 2006

(54) FLUORESCENT SUBSTANCE, LIGHT-EMITTING DIODE AND METHOD FOR PRODUCING FLUORESCENT SUBSTANCE

(75) Inventor: Kenji Matsuno, Kyotanabe (JP)

(73) Assignee: Seiwa Electric Mfg. Co., Ltd., Kyoto (JP)

(*) Notice: Subject to any disclaimer, the term of this patent is extended or adjusted under 35 U.S.C. 154(b) by 0 days.

(21) Appl. No.: 10/701,567

(22) Filed: Nov. 6, 2003

(65) Prior Publication Data
US 2004/0089846 A1 May 13, 2004

(30) Foreign Application Priority Data
Nov. 8, 2002 (JP) .................... 2002-325742

(51) Int. Cl.
C09K 11/56 (2006.01)
C09K 11/62 (2006.01)
C09K 11/55 (2006.01)

(52) U.S. Cl. .................................. 252/301.6 S
(58) Field of Classification Search ......... 252/301.4 S; 257/98, E33.061
See application file for complete search history.

(56) References Cited

U.S. PATENT DOCUMENTS

| | | | |
|---|---|---|---|
| 3,639,254 A * | 2/1972 | Peters | 252/301.4 S |
| 3,691,104 A * | 9/1972 | Hanada | 252/501.1 |
| 6,090,434 A | 7/2000 | Sugiura et al. | |
| 6,417,019 B1 * | 7/2002 | Mueller et al. | 438/29 |
| 6,544,438 B1 * | 4/2003 | Yocom et al. | 1/1 |
| 2002/0014614 A1 | 2/2002 | Yocom et al. | |

FOREIGN PATENT DOCUMENTS

| | | |
|---|---|---|
| EP | 0 740 490 A1 | 10/1996 |
| EP | 1 251 159 A2 | 10/2002 |
| JP | 2927279 B2 | 5/1999 |
| JP | 3246386 B2 | 11/2001 |

OTHER PUBLICATIONS

Benalloul P. et al., "$SrGa_2S_4$ : RE phosphors for full colour electroluminescent displays," Journal of Alloys and Compounds, Elsevier Science S.A., Paris, France, vol. 275-277, Jul. 24, 1998, pp. 709-715.

* cited by examiner

Primary Examiner—C. Melissa Koslow
(74) Attorney, Agent, or Firm—Birch, Stewart, Kolasch & Birch, LLP

(57) ABSTRACT

A fluorescent substance is obtained by weighing and mixing CaS, $Ga_2S_3$, EuS and $Ce_2S_3$ in a mole ratio of $(1-x)$:a:x:y (wherein $0.001 \leq x \leq 0.2$, $0.0001 \leq y \leq 0.02$ and $0.5 \leq a \leq 5$) and by sintering the mixture. A light-emitting diode comprises an LED chip 2 and an LED chip sealing portion 5, made of silicone resin and including the fluorescent substance, for enclosing the LED chip 2. Hence, a fluorescent substance that is excited by light having a predetermined wavelength to emit light, a light-emitting diode having excellent luminous efficiency and luminous intensity, and a method for producing the fluorescent substance are attained by the present invention.

2 Claims, 4 Drawing Sheets